US011750085B2

(12) United States Patent
Toyoda

(10) Patent No.: US 11,750,085 B2
(45) Date of Patent: Sep. 5, 2023

(54) ELECTRIC DEVICE

(71) Applicant: Koki Holdings Co., Ltd., Tokyo (JP)

(72) Inventor: Shinya Toyoda, Ibaraki (JP)

(73) Assignee: Koki Holdings Co., Ltd., Tokyo (JP)

( * ) Notice: Subject to any disclaimer, the term of this patent is extended or adjusted under 35 U.S.C. 154(b) by 47 days.

(21) Appl. No.: 17/606,439

(22) PCT Filed: Mar. 27, 2020

(86) PCT No.: PCT/JP2020/014094
§ 371 (c)(1),
(2) Date: Oct. 25, 2021

(87) PCT Pub. No.: WO2020/217853
PCT Pub. Date: Oct. 29, 2020

(65) Prior Publication Data
US 2022/0181969 A1 Jun. 9, 2022

(30) Foreign Application Priority Data

Apr. 26, 2019 (JP) ................................. 2019-086245

(51) Int. Cl.
*H02M 1/08* (2006.01)
*H02M 1/32* (2007.01)
(Continued)

(52) U.S. Cl.
CPC ............. *H02M 1/322* (2021.05); *H02M 1/08* (2013.01); *H02M 7/537* (2013.01);
(Continued)

(58) Field of Classification Search
CPC .... H02M 1/08; H02M 1/322; H03K 17/0822; H03K 17/063; H02P 27/06
See application file for complete search history.

(56) References Cited

U.S. PATENT DOCUMENTS

2002/0113615 A1\* 8/2002 Atarashi ............... H02P 29/662
318/400.01
2003/0156439 A1 8/2003 Ohmichi et al.
(Continued)

FOREIGN PATENT DOCUMENTS

| JP | 2003244966 | 8/2003 |
| JP | 2017028668 | 2/2017 |
| JP | 2018057178 | 4/2018 |

OTHER PUBLICATIONS

"International Search Report (Form PCT/ISA/210) of PCT/JP2020/014094," dated May 26, 2020, with English translation thereof, pp. 1-4.

(Continued)

*Primary Examiner* — Sibin Chen
(74) *Attorney, Agent, or Firm* — JCIPRNET

(57) ABSTRACT

An electric device is provided which can reduce risk of malfunction. This electric device is provided with a motor (31), an inverter circuit (30) which has switching elements (S1-S6) and which drives the motor (31), and a charge pump circuit (22) which generates the drive voltage of the switching elements (S1-S6). A discharge circuit (a discharge resistor R and a capacitor C1) is provided between a power line to which a drive voltage (VM) of the motor (31) is supplied and an output terminal (a VGT terminal) of the charge pump circuit (22). Energy of the surge voltage (Vs) generated in a parasitic inductance (Ls) when the switching elements (S4-S6) are turned off is absorbed by the discharge circuit (the discharge resistor R and the capacitor C1).

17 Claims, 7 Drawing Sheets

(51) Int. Cl.
  *H02M 7/537* (2006.01)
  *H03K 17/06* (2006.01)
  *H03K 17/082* (2006.01)
  *B25F 5/02* (2006.01)
  *H02M 7/5387* (2007.01)

(52) U.S. Cl.
  CPC ....... *H03K 17/063* (2013.01); *H03K 17/0822* (2013.01); *B25F 5/02* (2013.01); *H02M 7/5387* (2013.01)

(56) References Cited

U.S. PATENT DOCUMENTS

| | | | |
|---|---|---|---|
| 2015/0236635 A1* | 8/2015 | Goto | H03K 17/0822 318/504 |
| 2015/0244302 A1* | 8/2015 | Kumagai | H02P 6/085 318/400.27 |
| 2016/0248347 A1* | 8/2016 | Shinohara | H02P 3/18 |
| 2017/0033684 A1 | 2/2017 | Kawamoto | |
| 2017/0302200 A1* | 10/2017 | Marcinkiewicz | F25B 49/025 |

OTHER PUBLICATIONS

"Search Report of Europe Counterpart Application", dated May 11, 2022, p. 1-p. 8.

* cited by examiner

ELECTRIC DEVICE

CROSS-REFERENCE TO RELATED APPLICATION

This application is a 371 application of the International PCT application serial no. PCT/JP2020/014094, filed on Mar. 27, 2020, which claims the priority benefits of Japan Patent Application No. 2019-086245, filed on Apr. 26, 2019. The entirety of each of the above-mentioned patent applications is hereby incorporated by reference herein and made a part of this specification.

TECHNICAL FIELD

The present invention relates to an electric device that generates a drive voltage of an inverter circuit for driving a motor using a charge pump circuit.

RELATED ART

Patent Literature 1 described below discloses an electric device that drives a motor using an inverter circuit. This electric device is driven by AC power, and includes an electrolytic capacitor for absorbing a surge between the circuit and the output terminal of a diode bridge that supplies DC power to the inverter circuit.

CITATION LIST

Patent Literature

Patent Literature 1

Japanese Patent Laid-Open No. 2018-057178

SUMMARY OF INVENTION

Technical Problem

A surge voltage is generated in a parasitic inductance of wiring at the timing at which a part of a switching element of the inverter circuit is turned off. The surge voltage may cause the voltage of the output terminal of the charge pump circuit to rise above a set value of the output voltage of the charge pump circuit. A risk of malfunction increases if a voltage of the output terminal of the charge pump circuit exceeds a withstand voltage of the circuit element.

The present invention has been conceived in recognition of the above-described circumstances, and the present invention is to provide an electric device that can reduce a risk of malfunction.

Solution to Problem

An aspect of the present invention is an electric device. The electric device includes a motor, an inverter circuit that has a switching element and drives the motor, and a charge pump circuit that generates a drive voltage of the switching element, and a discharge circuit is provided between a power line on which a drive voltage of the motor is supplied and an output terminal of the charge pump circuit.

Here, a discharge element may be provided between the power line and the output terminal of the charge pump circuit.

Another aspect of the present invention is an electric device. The electric device includes a motor, an inverter circuit that has a switching element and drives the motor, and a charge pump circuit that generates a drive voltage of the switching element, and a discharge element is provided between a power line on which a drive voltage of the motor is supplied and an output terminal of the charge pump circuit.

Here, the output terminal of the charge pump circuit may have a higher potential than the power line.

The switching element may include a high voltage side switching element connected to the power line and a low voltage side switching element connected to a ground line, the charge pump circuit may have a high voltage side part connected to a control terminal of the high voltage side switching element and a low voltage side part connected to the low voltage side switching element, and the discharge element may be provided between the power line and the high voltage side part.

A diode connecting an interconnection part of the high voltage side switching element and the low voltage side switching element and the high voltage side part of the charge pump circuit may be provided, and the cathode of the diode may be connected to the high voltage side part.

The discharge element may be a resistor.

The discharge element may be a Zener diode.

Further, any combination of the above-described constituent elements and an expression of the present invention converted into a method or a system are valid as aspects of the present invention.

Effects of Invention

According to the present invention, an electric device that can reduce a risk of malfunction can be provided.

DESCRIPTION OF EMBODIMENTS

Figure 1:
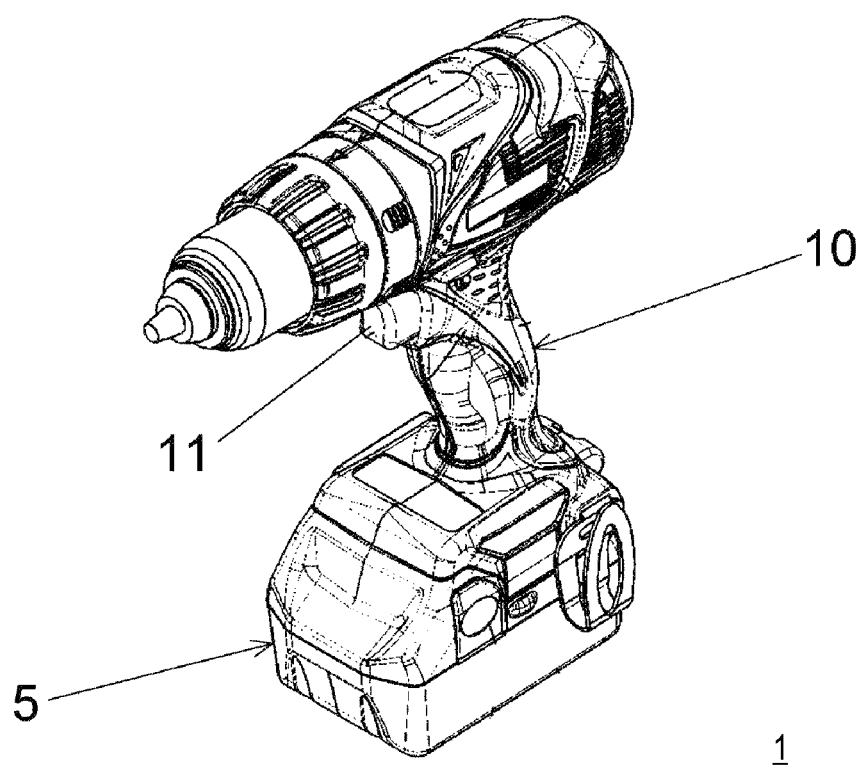
FIG. 1 is a perspective view of an electric tool 1 according to an embodiment of the present invention.

Exemplary embodiments of the present invention will be described in detail with reference to the drawings. Further, the same reference numerals are given to the same or equivalent constituent elements, members, and the like illustrated in the drawings, and overlapping description thereof is appropriately omitted. In addition, the embodiments are merely examples that do not limit the invention, and not all features and combinations thereof described in the embodiments are necessarily essential to the invention.

Figure 2:
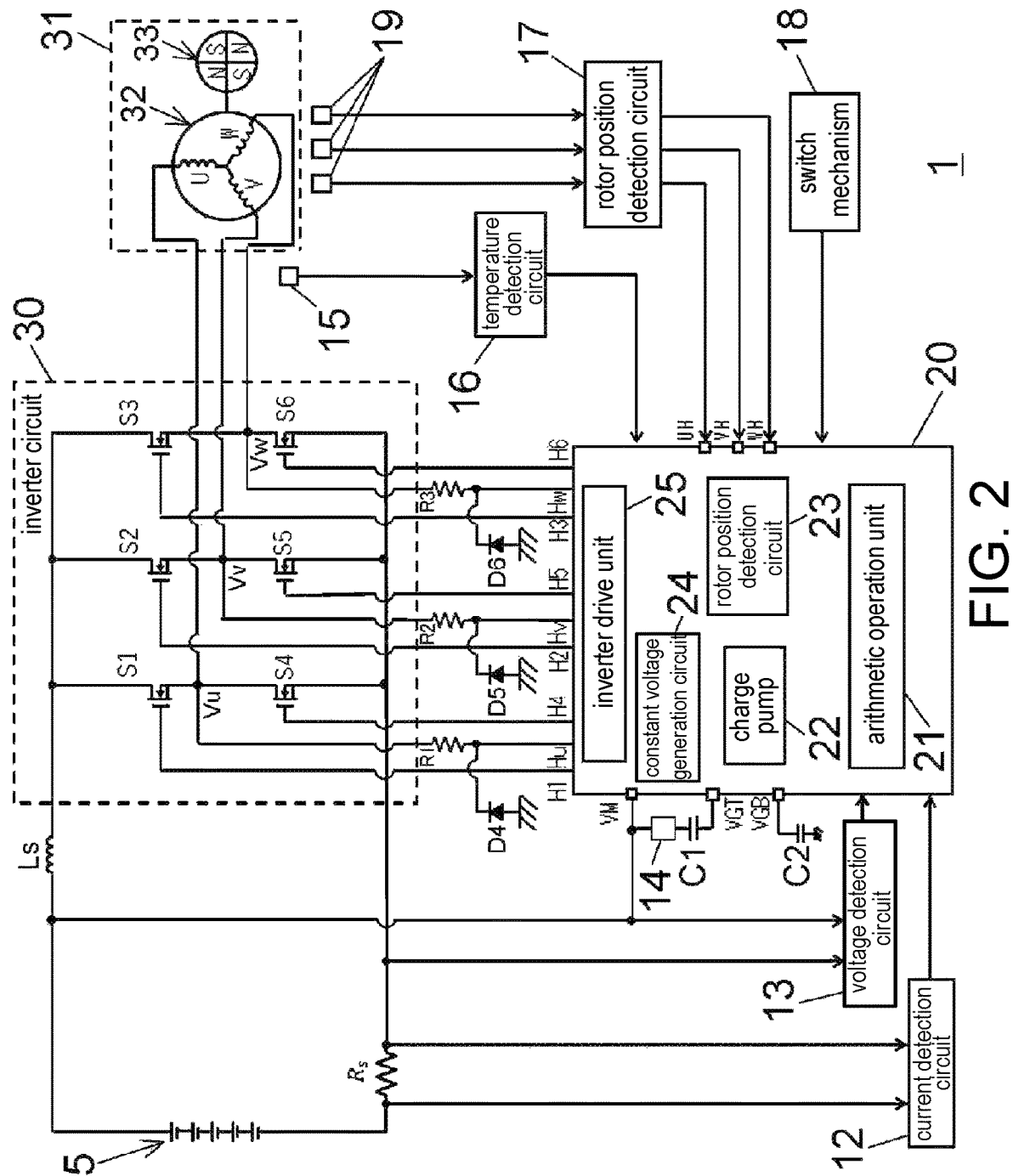
FIG. 2 is a circuit block view of the electric tool 1.

The present invention relates to an electric tool 1. The electric tool 1 is an example of an electric device. The electric tool 1 includes an electric tool body 10 and a battery pack 5 as illustrated in FIG. 1. The battery pack 5 is detachably connected to the electric tool body 10. When an operator pulls a trigger 11 of the electric tool body 10, power is supplied from the battery pack 5 to the electric tool body 10. The mechanical configuration of the electric tool 1 is not described here since it is known. A circuit configuration of the electric tool 1 will be described below. The electric tool 1 includes a motor 31, an inverter circuit 30, and a control unit 20 as illustrated in FIG. 2. The motor 31 is an inner-rotor brushless motor here, having a stator 32 and a rotor 33. The stator 32 has U-phase, V-phase, and W-phase stator windings that are in a star connection (Y connection).

The inverter circuit 30 converts a DC output by the battery pack 5 to an AC to supply it to each stator winding of the stator 32 and to drive the motor 31. A parasitic inductance (wiring inductance) Ls is present on a wiring path between the battery pack 5 and the inverter circuit 30. No capacitor (electrolytic capacitor) for absorbing a surge is provided between the circuit and the output terminal of the battery pack 5. The inverter circuit 30 includes switching elements S1 to S6 such as FETs or IGBTs connected in a three-phase bridge. Each of drains or sources of the switching elements S1 to S6 is connected to the stator windings U, V, and W that are in the star connection. The switching elements S1 to S6 are turned on when a voltage input to the gate (control terminal) of each switching element is at a high level, and turned off when the voltage is at a low level. The control unit 20 controls the on and off states of the switching elements S1 to S6.

Each gate of the switching elements S1 to S6 is connected to an inverter drive unit 25 of the control unit 20, and the switching elements S1 to S6 perform a switching operation due to switching element drive signals H1 to H6 input from the inverter drive unit 25. Thus, the DC voltage applied to the inverter circuit 30 from the battery pack 5 is supplied to each of the U-phase, V-phase, and W-phase stator windings as three phase (U-phase, V-phase, and W-phase) voltages Vu, Vv, and Vw. Reverse voltage signals Hu, Hv, and Hw that have been generated in each of the stator windings are input to the control unit 20.

A resistor R1 is provided on the path through which the reverse voltage signal Hu reaches the control unit 20. One end of the resistor R1 is connected to an interconnection part of the switching elements S1 and S4. The other end of the resistor R1 is connected to the cathode of a diode D4 and the control unit 20. The anode of the diode D4 is connected to the ground. A resistor R2 is provided on the path through which the reverse voltage signal Hv reaches the control unit 20. One end of the resistor R2 is connected to an interconnection part of the switching elements S2 and S5. The other end of the resistor R2 is connected to the cathode of a diode D5 and the control unit 20. The anode of the diode D5 is connected to the ground. A resistor R3 is provided on the path through which the reverse voltage signal Hw reaches the control unit 20. One end of the resistor R3 is connected to an interconnection part of the switching elements S3 and S6. The other end of the resistor R3 is connected to the cathode of a diode D6 and the control unit 20. The anode of the diode D6 is connected to the ground. The resistors R1 to R3 and the diodes D4 to D6 are protection elements for absorbing negative components of a surge voltage Vs generated in the parasitic inductance Ls.

Figure 4:
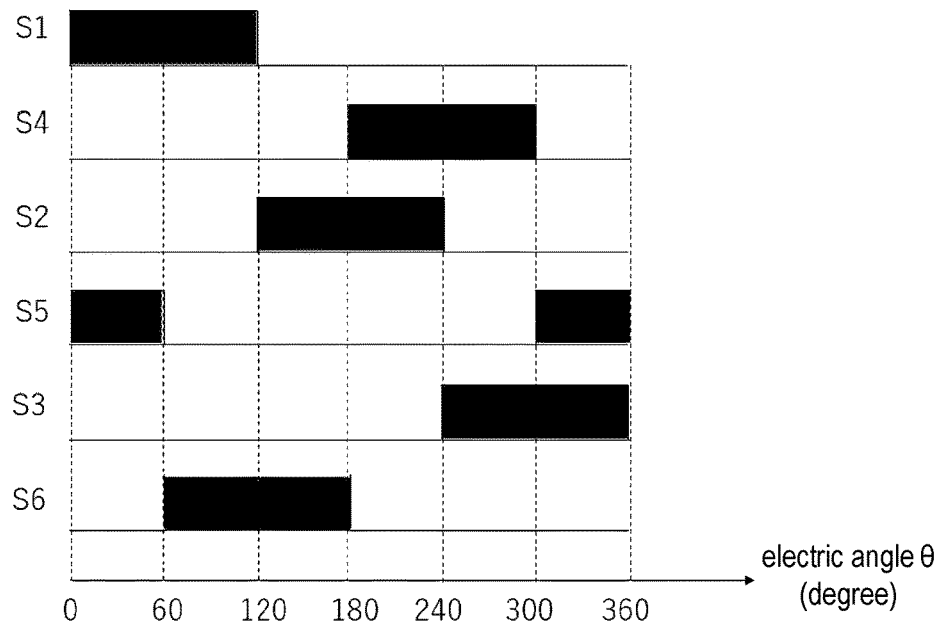
FIG. 4 is a time chart showing on and off states of switching elements S1 to S6 of FIG. 2.

An energization method using the inverter circuit 30 is the known 120-degree energization (square wave driving) in which the high side (high voltage side) switching elements S1 to S3 are turned on every 120 degrees of one cycle of 360 degrees and the low side (low voltage side) switching elements S4 to S6 are turned on every 120 degrees of one cycle of 360 degrees as illustrated in FIG. 4. In FIG. 4, the on state periods of the switching elements S1 to S6 are shown in black. In the on state periods, at least one of the high side switching elements S1 to S3 and the low side switching elements S4 to S6 may be controlled for pulse width modulation (PWM).

A current detection circuit 12 detects a drive current of the motor 31 using a voltage of a resistor Rs provided on the path of a drive current of the motor 31 (current flowing in each stator winding of the stator 32) and transmits the drive current to the control unit 20. A voltage detection circuit 13 detects an output voltage of the battery pack 5 (an input voltage to the inverter circuit 30) and transmits the output voltage to the control unit 20. The output voltage of the battery pack 5 is input to a VM terminal of the control unit 20. A discharge element (power consumption element) 14 and a second discharge element (capacitor C1) are connected in series between the VM terminal and a VGT terminal of the control unit 20. A capacitor C2 is connected between a VGB terminal of the control unit 20 and the ground. In other words, the discharge element 14, the capacitor C1, and the capacitor C2 are provided outside separately from the control unit 20.

A temperature detection element 15 is, for example, a thermistor, and is provided near the motor 31 or the inverter circuit 30. A temperature detection circuit 16 detects a temperature of the motor 31 or the inverter circuit 30 using the output voltage of the temperature detection element 15 and transmits the temperature to the control unit 20. A Hall IC 19 is an example of a magnetic detection element, and, for example, three Hall ICs are provided near the motor 31. A rotor position detection circuit 17 is a filter circuit that removes noise from output signals of the Hall ICs 19. Three output signals of the rotor position detection circuit 17 are input to each of a UH terminal, a VH terminal, and a WH terminal of the control unit 20. A switch mechanism 18 switches between an on state and an off state in conjunction with operations of the trigger 11 of FIG. 1 and transmits a switch operation detection signal to the control unit 20.

Figure 3:
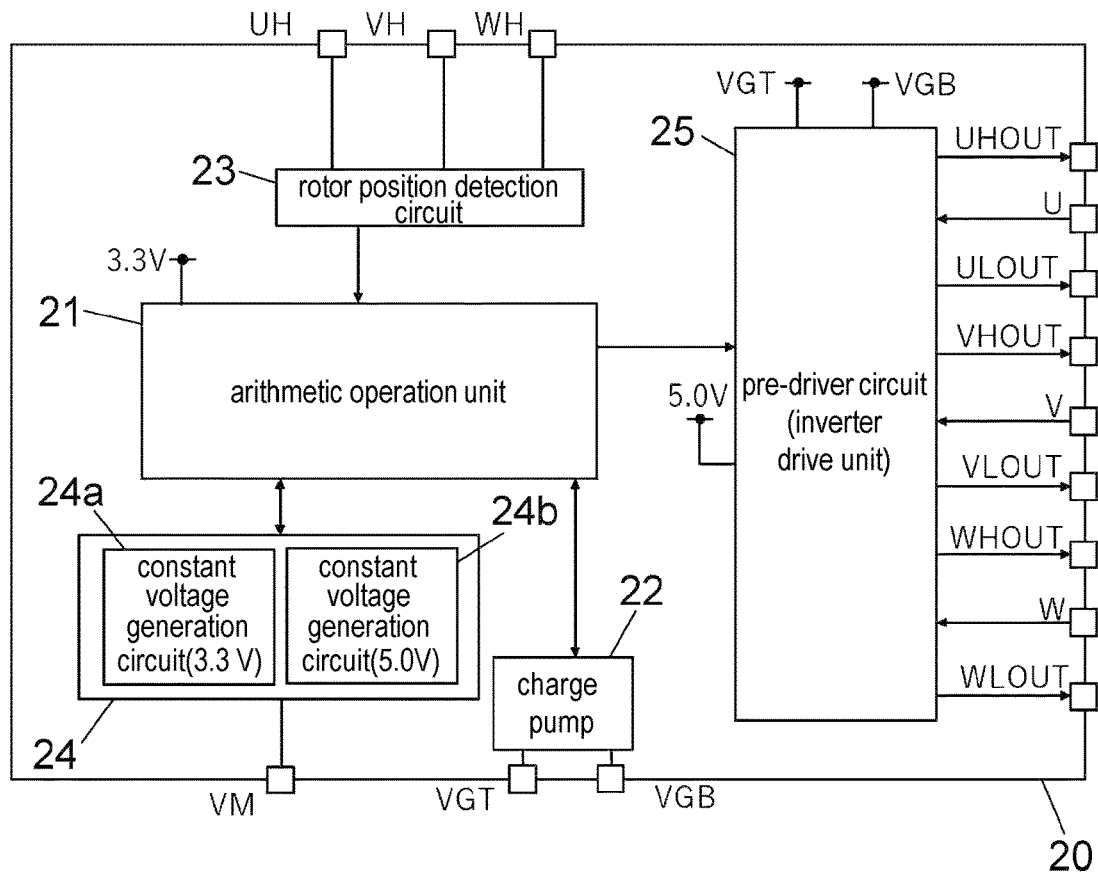
FIG. 3 is a circuit block view of a control unit 20 of FIG. 2.

FIG. 3 is a specific configuration example of the control unit 20. The control unit 20 may use a universal motor control integrated circuit (IC) suitable for controlling a three-phase DC brushless motor. The control unit 20 includes multiple external terminals as means for establishing electrical connections to the outside. The UH terminal, VH terminal, and WH terminal are input terminals for inputting signals from the three Hall ICs 19. A UHOUT terminal, a ULOUT terminal, a VHOUT terminal, a VLOUT terminal, a WHOUT terminal, and a WLOUT terminal are output terminals for outputting drive signals for the inverter circuit 30 (the switching element drive signals H1 to H6 of FIG. 2). A U terminal, a V terminal, and a W terminal are input terminals for detecting reverse voltages (the reverse voltage signals Hu, Hv, and Hw of FIG. 2) generated in the stator windings. The VGT terminal is a terminal at which a high side gate drive voltage (high side charge pump voltage) VGT output by the charge pump circuit 22 appears. The VGB terminal is a terminal at which a low side gate drive voltage (low side charge pump voltage) VGB output by the charge pump circuit 22 appears. The VM terminal is a power supply terminal for receiving supply of a power supply voltage VM from the battery pack 5. In the present embodiment, the capacitor C1 and the discharge element 14 are externally connected in series between the VM terminal and the VGT terminal of the control unit 20 as described above. The reason for this will be described below. Although not illustrated, the control unit 20 is provided with terminals that receive output signals of the current detection circuit 12, the voltage detection circuit 13, the temperature detection circuit 16, and the switch mechanism 18, and each of the terminals is connected to an arithmetic operation unit 21.

The control unit 20 includes the arithmetic operation unit 21, the charge pump circuit 22, a rotor position detection circuit 23, a constant voltage generation circuit 24, and an inverter drive unit (pre-driver circuit) 25. The constant voltage generation circuit 24 includes a constant voltage generation circuit 24a that outputs 3.3 V and a constant voltage generation circuit 24b that outputs 5.0 V. 3.3 V is supplied to the arithmetic operation unit 21 as an operation voltage. 5.0 V is supplied to the inverter drive unit 25. The charge pump circuit 22 operates under control of the arithmetic operation unit 21, generates a high side gate drive voltage (here, 31 V) that is higher than an output voltage (here, 18 V) of the battery pack 5 and a low side gate drive voltage (here, 13 V), and supplies the voltages to the inverter drive unit 25. Further, the charge pump circuit 22 has a high voltage side part (high side charge pump) and a low voltage side part (low side charge pump), and the high voltage side part generates a high side gate drive voltage while the low voltage side part generates a low side gate drive voltage. The rotor position detection circuit 23 detects a rotation position of the motor 31 based on signals input from the UH terminal, the VH terminal, and the WH terminal and transmits the rotation position to the arithmetic operation unit 21. The arithmetic operation unit 21 generates gate control signals based on the signal from the rotor position detection circuit 23 and outputs the gate control signals to the inverter drive unit 25. The number of gate control signals is six corresponding to the switching elements S1 to S6 of the inverter circuit 30, each of which is a binary signal that is at a high level when the switching elements S1 to S6 are to be turned on and is at a low level when the elements are to be turned off. The inverter drive unit 25 generates gate voltages (the switching element drive signals H1 to H6) that has increased the current capacity of each gate control signal, and outputs the gate voltages to the gates (control terminals) of the switching elements S1 to S6 of the inverter circuit 30. Each gate voltage has a high level when the corresponding gate control signal is at a high level, and has a low level when the gate control signal is at a low level.

Figure 5:
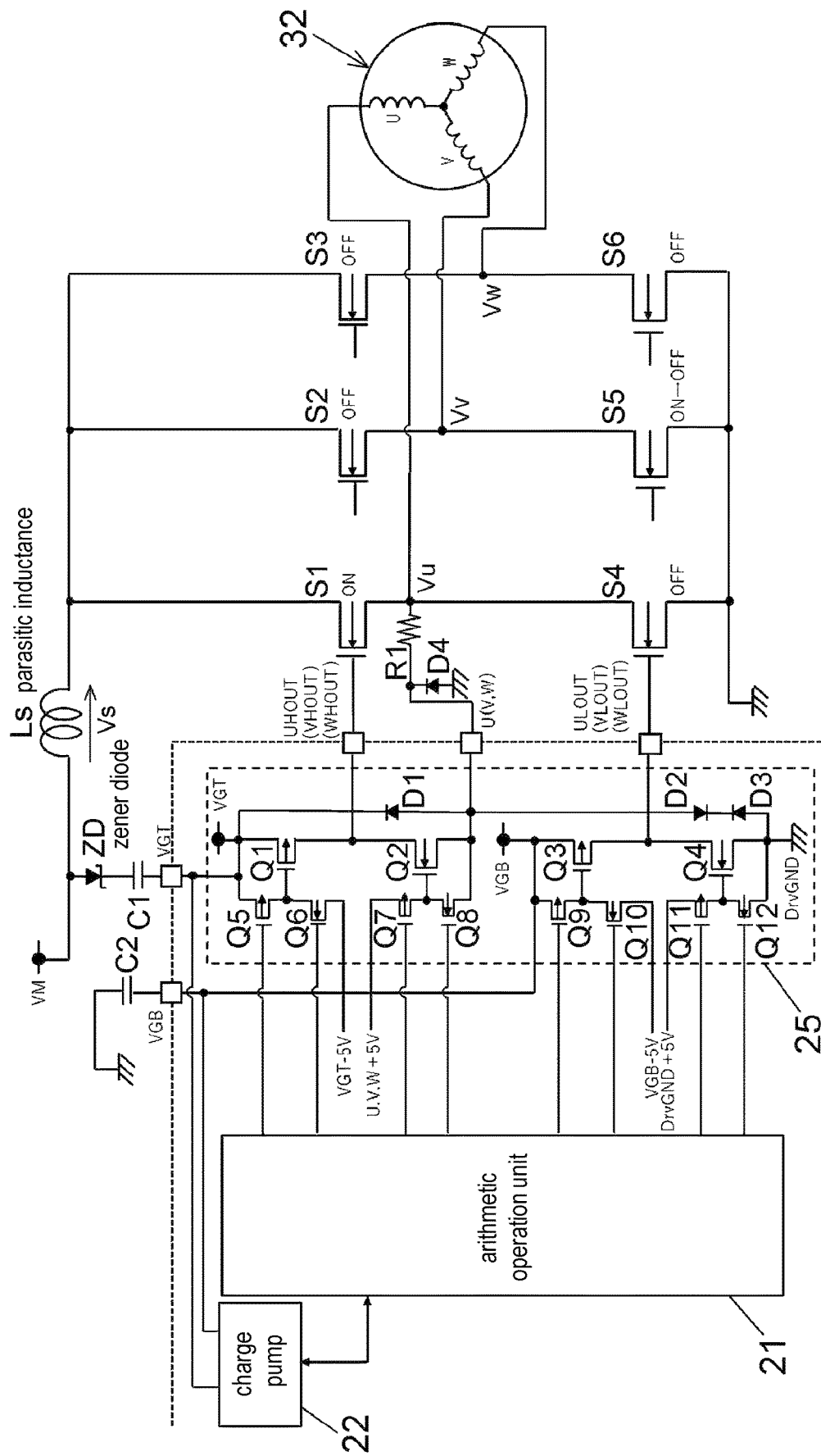
FIG. 5 is a main circuit block view of the electric tool 1 when a discharge element 14 of FIG. 2 is set as a Zener diode ZD.
Figure 6:
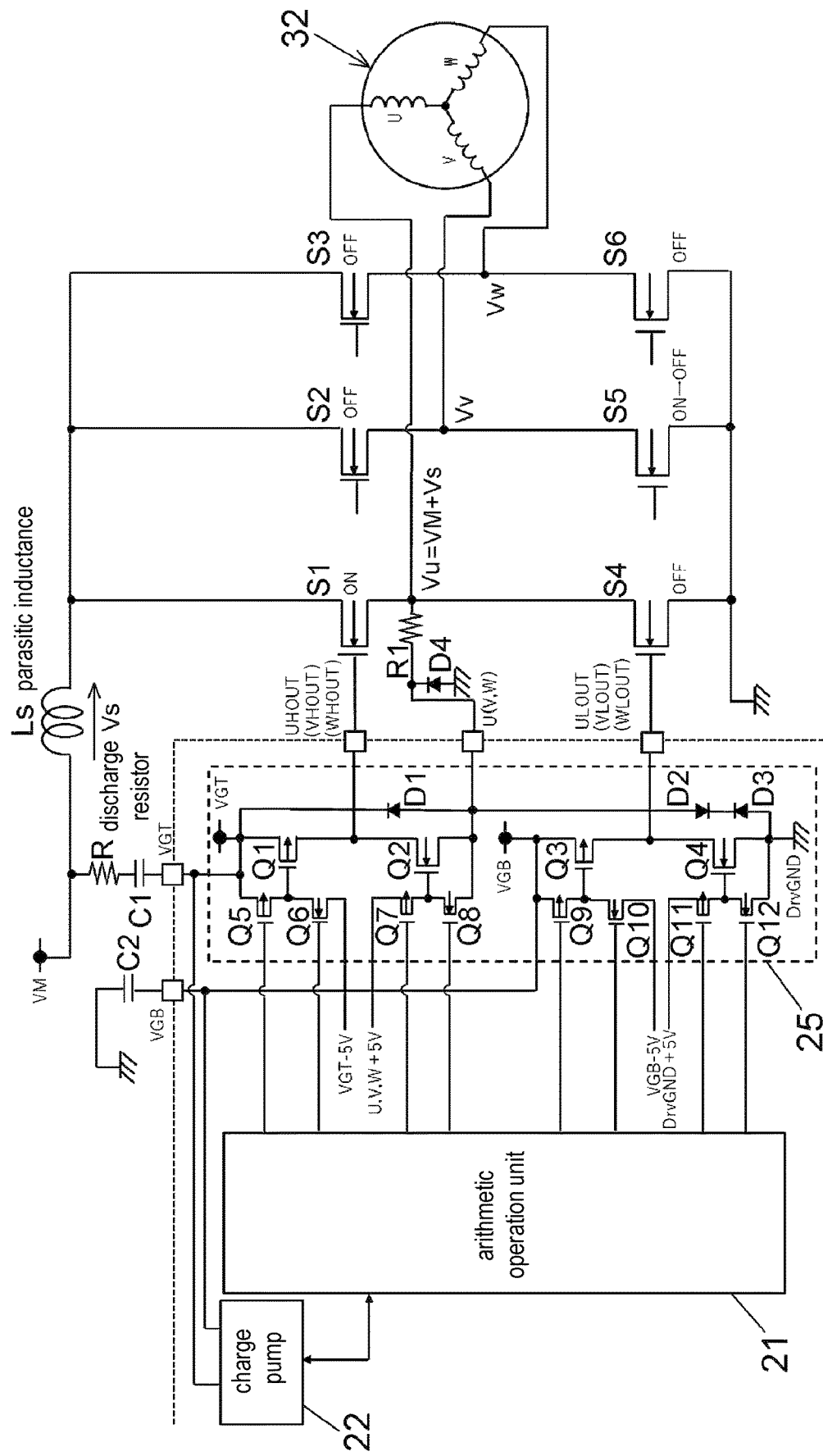
FIG. 6 is a main circuit block view of the electric tool 1 when the discharge element 14 of FIG. 2 is set as a resistor R.
Figure 7:
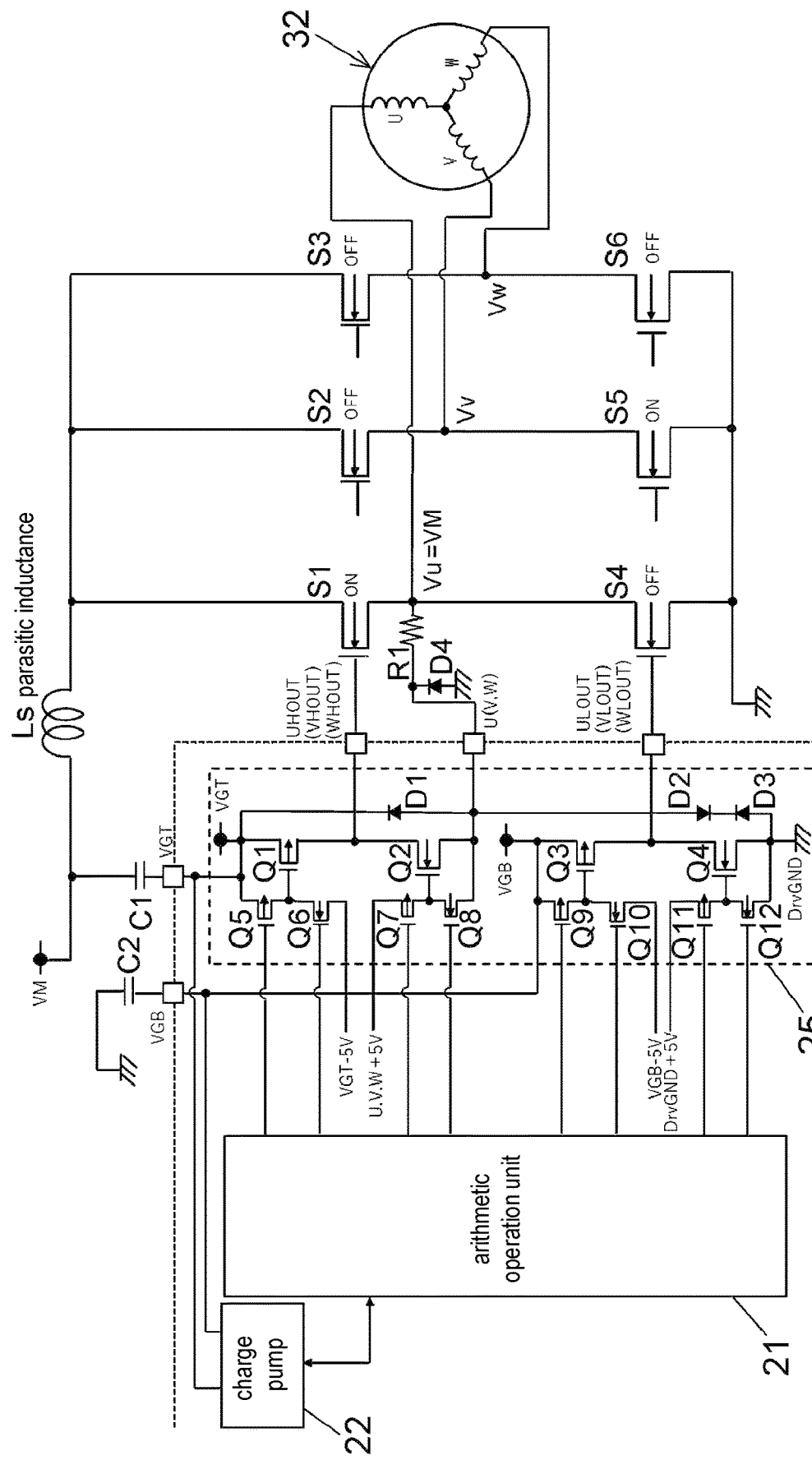
FIG. 7 is a main circuit block view of a comparative example in which the discharge element 14 of FIG. 2 is not provided.

FIG. 5 is a main circuit block view of the electric tool 1 when the discharge element 14 of FIG. 2 is set as a Zener diode ZD. FIG. 6 is a main circuit block view of the electric tool 1 when the discharge element 14 of FIG. 2 is set as a resistor R. The resistor R is a fixed resistor. FIG. 7 is a main circuit block view of a comparative example in which the discharge element 14 of FIG. 2 is not provided. In FIGS. 5 to 7, the part of the internal circuits of the inverter drive unit 25 related to driving of the switching elements S1 and S4 is illustrated. Although not illustrated, the part of the internal circuits of the inverter drive unit 25 related to driving of the switching elements S2 and S5 and the part thereof related to driving of the switching elements S3 and S6 are also configured and operate similarly to the part related to driving of the switching elements S1 and S4.

The inverter drive unit 25 includes switching elements Q1 to Q12 such as FETs. The switching elements Q1, Q3, Q5, Q7, Q9, and Q11 are of a P-channel type, and the switching elements Q2, Q4, Q6, Q8, Q10, and Q12 are of an N-channel type. A diode D1 is provided between the U terminal (the interconnection part of the switching elements S1 and S4) and the VGT terminal. The anode of the diode D1 is connected to the U terminal, and the cathode thereof is connected to the VGT terminal. Diodes D2 and D3 are provided between the U terminal and the ground. The anode of the diode D2 is connected to the U terminal. The cathodes of the diodes D2 and D3 are connected to each other. The anode of the diode D3 is connected to the ground.

The arithmetic operation unit 21 inputs a gate control signal for outputting a gate voltage of the switching element S1 to the gates (control terminals) of the switching elements Q5 to Q8. When the gate control signal input to the switching elements Q5 to Q8 is at a high level, the switching elements Q5 and Q7 are turned off, the switching elements Q6 and Q8 are turned on, the switching element Q1 is turned on, the switching element Q2 is turned off, and the switching element S1 is turned on. When the gate control signal input to the switching elements Q5 to Q8 is at a low level, the switching elements Q5 and Q7 are turned on, the switching elements Q6 and Q8 are turned off, the switching element Q1 is turned off, the switching element Q2 is turned on, and the switching element S1 is turned off. Likewise, when a gate control signal input to the switching elements Q9 to Q12 from the arithmetic operation unit 21 is at a high level, the switching element S4 is turned on, and when the gate control signal is at a low level, the switching element S4 is turned off.

Figure 8:
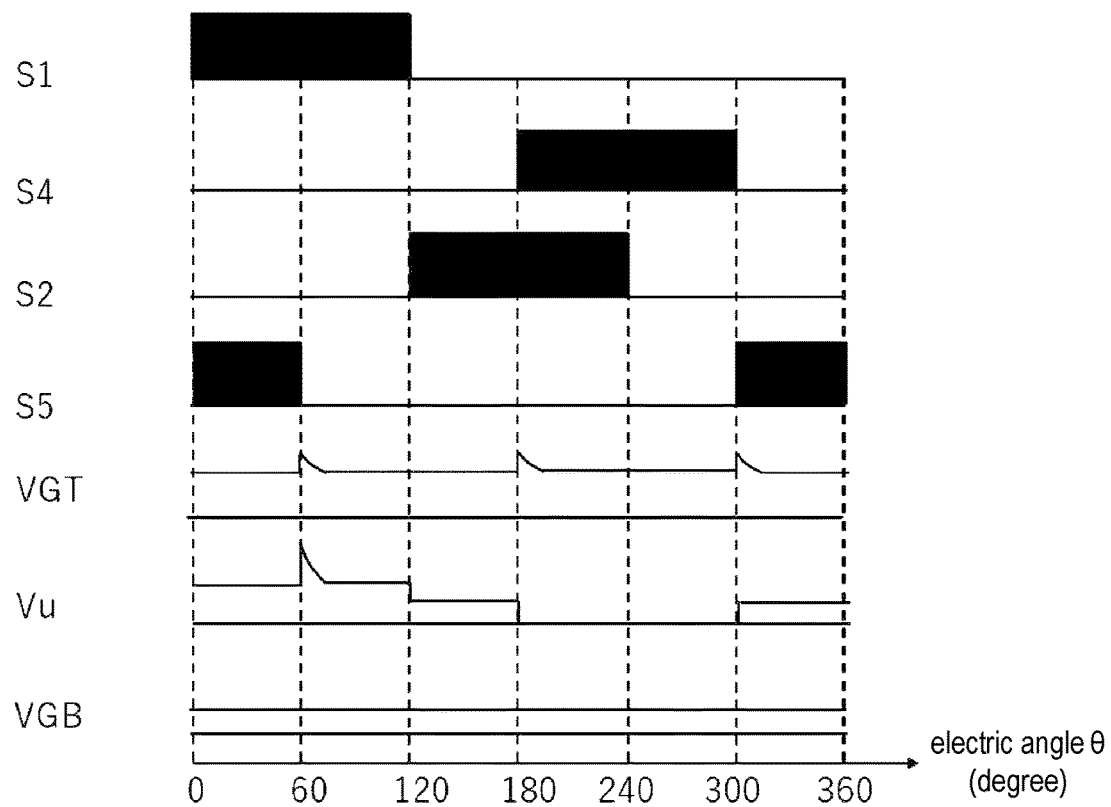
FIG. 8 is a time chart showing the on and off states of the switching elements S1, S2, S4, and S5 of the circuit in FIG. 6 and the waveforms of a high side charge pump voltage VGT, a drain-source voltage Vu of the switching element S4, and a low side charge pump voltage VGB.

FIG. 8 is a time chart showing the on and off states of the switching elements S1, S2, S4, and S5 of the circuit in FIG. 6, and the waveforms of a high side charge pump voltage VGT, a drain-source voltage Vu of the switching element S4, and a low side charge pump voltage VGB. As an example, an operation when an electrical angle θ is between zero to 60 degrees will be described with reference to FIGS. 5, 6, and 8. In the range of an electrical angle θ from zero to 60 degrees, the switching elements S1 and S5 are in the on state, and the other switching elements are in the off state. In this moment, the drain-source voltage Vu of the switching element S4 satisfies Vu=VM.

At the electrical angle θ of 60 degrees, the switching element S5 switches from the on state to the off state. FIGS. 5 and 6 illustrate the state immediately after the switching element S5 is turned off and before the switching element S6 is turned on at the electrical angle θ of 60 degrees, in which a surge voltage Vs is generated at the parasitic inductance Ls. At this moment, energy accumulated at the parasitic inductance Ls is applied as the surge voltage Vs between the drain and source of the switching element S4 via the switching element S1, and thus the drain-source voltage Vu of the switching element S4 satisfies Vu=VM+Vs. When the surge voltage Vs causes the drain-source voltage Vu of the switching element S4 to be higher than the high side charge pump voltage VGT, a charging current flows to the VGT terminal via the diode D1.

Because the charging current is consumed by the Zener diode ZD connected between the VGT terminal and the VM terminal in the circuit of FIG. 5, the high side charge pump voltage VGT is a substantially constant voltage at all times. In other words, a discharge circuit including the Zener diode ZD is formed between the VGT terminal and the VM terminal. The VGT terminal has a higher potential than the VM terminal. The discharge circuit is formed by, for example, the Zener diode ZD, the parasitic inductance Ls, the switching element S1, the diode D1, and the capacitor C1. In the case in which the Zener diode ZD is used as a protective element as described above, energy of the surge voltage Vs generated at the parasitic inductance Ls when the low-side (lower arm side) switching elements S4 to S6 are turned off, the energy making Vu greater than VGT, is consumed by an instantaneous large current flowing in the Zener diode ZD forming the discharge circuit. For this reason, a diode with large permissible loss needs to be used for the Zener diode ZD, and thus the external dimensions of the Zener diode ZD increase, which causes costs for components to increase. Further, the capacitor C1 may not be provided in series with the Zener diode ZD, and the surge voltage Vs can be consumed by an instantaneous large current flowing in the Zener diode ZD in this case as well.

In the circuit of FIG. 6, a charging current is consumed as heat by the resistor R connected between the VGT terminal and the VM terminal. A discharge circuit including the resistor R between the VGT terminal and the VM terminal is formed as in the circuit of FIG. 5. The VGT terminal has a higher potential than the VM terminal in this case as well. The discharge circuit is formed by, for example, the resistor R, the parasitic inductance Ls, the switching element S1, the diode D1, and the capacitor C1. A charging current of this case flows at a relatively low level for a relatively short period of time according to Ohm's low, unlike in the case in which the protective element is the Zener diode ZD. The high side charge pump voltage VGT is higher in the period in which a current flows in the resistor R forming the discharge circuit than in the other period. By selecting an appropriate resistance value of the resistor R, a rise in the high side charge pump voltage VGT can be curbed in a tolerable range. Although the Zener diode ZD has a relatively high risk of malfunction such as short-circuiting, the resistor R that is a passive element has a low risk of malfunction such as short-circuiting, and thus reliability is enhanced. Further, the capacitor C1 may not be provided in series with the resistor R, and the surge voltage Vs can be consumed by a current flowing in the resistor R in this case as well.

In the circuit of the comparative example in FIG. 7, only the capacitor C1 serving as a second discharge element is provided with no element to consume power between the VGT terminal and the VM terminal, and thus the high side charge pump voltage VGT significantly rises. The maximum rating of the high side charge pump voltage VGT in the charge pump circuit 22 is, for example, 48 V. The high side charge pump voltage VGT is highly likely to exceed the maximum rating due to the surge voltage Vs in the circuit of the comparative example in FIG. 7, and thus the high side charge pump has a high risk of malfunction. However, if the surge voltage Vs is low, only the capacitor C1 serving as the second discharge element can absorb the surge voltage Vs without the discharge element 14 illustrated in FIGS. 5 and 6. Also in this case, a discharge circuit including the capacitor C1 is formed between the VGT terminal and the VM terminal. This discharge circuit is formed by, for example, the capacitor C1, the parasitic inductance Ls, the switching element S1, and the diode D1.

Figure 9:
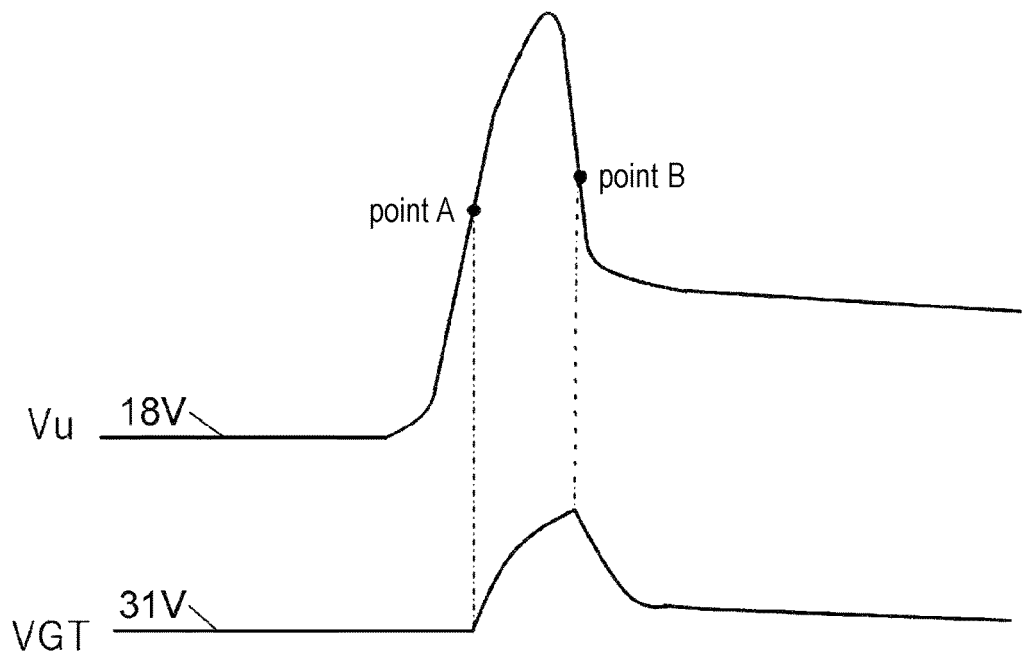
FIG. 9 is a graph showing enlarged waveforms of the voltages Vu and VGT around an electric angle θ of 60 degrees of FIG. 8.

FIG. 9 is a graph showing enlarged waveforms of the voltages Vu and VGT at the electrical angle θ of about 60 degrees in FIG. 8. Because the voltage VGT starts to rise at point A at which Vu is greater than VGT, the voltage VGT then starts to drop from point B at which VGT is greater than Vu as illustrated in FIG. 9. The delayed rise of the voltage VGT behind the rise of the voltage Vu and the time lag between the peak of the voltage Vu and the voltage VGT are attributable to the resistor R1. Although the voltage fluctuation illustrated in FIG. 9 is caused by the surge voltage Vs of the parasitic inductance Ls resulting from the switching element S5 turned off at the electrical angle θ of 60 degrees, the switching element S6 turned off at the electrical angle θ of 180 degrees, and the switching element S4 turned off at the electrical angle θ of 300 degrees cause the surge voltage Vs to be generated at the parasitic inductance Ls likewise, and thus similar voltage fluctuation to that illustrated in FIG. 9 takes place.

According to the present embodiment, the following effects can be exhibited.

(1) The discharge circuit is configured between the VGT terminal at which the high side charge pump voltage VGT generated by the charge pump circuit 22 appears and the VM terminal to which the output voltage VM of the battery pack 5 is input, and thus energy of the surge voltage Vs generated in the parasitic inductance Ls when the low side switching elements S4 to S6 are turned off can be consumed by the discharge circuit. Thus, a risk of malfunction of the circuit element (the charge pump 22, particularly the high side (high voltage side) charge pump) caused when the high side charge pump voltage VGT jumps up can be curbed.

In addition, because the discharge element 14 is provided between the VGT terminal and the VM terminal, the energy of the surge voltage Vs generated in the parasitic inductance Ls when the low side switching elements S4 to S6 are turned off can be consumed by the discharge element 14. Thus, a risk of malfunction of the circuit element (the charge pump 22, particularly the high side (high voltage side) charge pump) caused when the high side charge pump voltage VGT jumps up can be curbed. In addition, because the second discharge element (capacitor C1) is provided between the VGT terminal and the VM terminal, the energy of the relatively low surge voltage Vs generated in the parasitic inductance Ls when the low side switching elements S4 to S6 are turned off can be consumed by the second discharge element.

(2) In the case in which the discharge element 14 is set to the Zener diode ZD as illustrated in FIG. 5, the high side charge pump voltage VGT can be set to be substantially constant at all times.

(3) In the case in which the discharge element 14 is set to the resistor R as illustrated in FIG. 6, a risk of malfunction such as short-circuiting is low while the high side charge pump voltage VGT fluctuates to some degree, and thus reliability is enhanced, and costs for components can be reduced.

(4) By providing the discharge element 14 as described above, demerits, in other words, the effects brought by not tolerating significant fluctuation in the high side charge pump voltage VGT can be reduced while obtaining merits of the charge pump method described below. This point is described in the following. Methods for driving the high side (upper arm side) switching elements S1 to S3 include a bootstrap method in addition to the charge pump method. The bootstrap method has demerits that a period in which a bootstrap capacitor is charged during driving of the motor is required and a 100% duty cycle cannot be maintained for a long period of time. In contrast, the charge pump method of the present embodiment has merits that the bootstrap capacitor does not need to be charged during driving of the motor 31 and a 100% duty cycle can be maintained for a long period of time. Meanwhile, in the bootstrap method, voltage fluctuation is allowed due to a floating power supply, and voltage fluctuation caused by the surge voltage Vs generated in the parasitic inductance Ls does not really matter. In contrast, the charge pump method of the present embodiment has the concept of maintaining a constant voltage with respect to the ground at all times (having a grounded power supply), fluctuation of the high side charge pump voltage VGT caused by the surge voltage Vs is a problem. In the present embodiment, fluctuation of the high side charge pump voltage VGT caused by the surge voltage Vs can be curbed by the discharge element 14, and thus the effect of the demerits of the charge pump method can be reduced.

(5) Because the discharge element 14 consumes energy of the surge voltage Vs of the parasitic inductance Ls, there is no need to provide an electrolytic capacitor for absorbing the surge between the circuit and the output terminal of the battery pack 5, and thus costs can be reduced.

(6) Because the discharge element 14 is provided outside separately from the control unit 20, the discharge element can be selected alone according to product specifications, which improves a degree of freedom in design, and a risk of malfunction of the circuit element when the high side charge pump voltage jumps up can be easily reduced, compared to a configuration in which the discharge element is integrated with the control unit 20 as one package.

(7) With the configuration in which the discharge element 14 is connected in series with the capacitor C1 between the VGT terminal at which the high side charge pump voltage VGT generated by the charge pump circuit 22 appears and the VM terminal to which the output voltage VM of the battery pack 5 is input, a withstand voltage of the discharge element serving as a protective element can be reduced compared to a case in which a discharge element is connected between a VGT terminal and a ground line. Further, in the case in which a discharge element is connected between a VGT terminal and a ground line, a voltage gained by adding a surge voltage to a power supply voltage (battery voltage) is applied to the discharge element, and thus a withstand voltage needs to be increased.

Although the present invention has been described exemplifying the embodiments above, it should be understood by a person skilled in the art that each constituent element and process described in the embodiments can be variously modified in the scope of the claims. A modified example is described below.

The electric device of the present invention is not limited to DC driving (cordless type), may be applied to AC driving (corded type), may be an electric work machine or a power tool other than an electric tool, and may be another type of electric device. Specific voltage values and the like described in the embodiments are merely examples, and can be appropriately changed.

The invention claimed is:

1. An electric device comprising:
a motor;
an inverter circuit configured to have a switching element including a high voltage side switching element connected to a power line on which a drive voltage of the motor is supplied and a low voltage side switching element connected to a ground line, and drive the motor;
a charge pump circuit configured to generate a drive voltage of the switching element; and
an inverter drive unit configured to drive the inverter circuit, the inverter drive unit having a high voltage side part connected to a control terminal of the high voltage side switching element and a low voltage side part connected to the low voltage side switching element;
wherein a discharge circuit is provided between the power line and the high voltage side part,
wherein the electric device further comprises a diode connecting an interconnection part of the high voltage side switching element and the low voltage side switching element and the high voltage side part, and
wherein a cathode of the diode is connected to the high voltage side part.

2. The electric device according to claim 1, wherein the discharge circuit has a discharge element provided between the power line and the output terminal of the charge pump circuit.

3. The electric device according to claim 2, wherein the discharge element is a resistor.

4. The electric device according to claim 2, wherein the discharge element is a Zener diode.

5. The electric device according to claim 1, wherein the output terminal of the charge pump circuit has a higher potential than the power line.

6. The electric device according to claim 1, wherein a plurality of the high voltage side switching element are provided,
wherein the high voltage side part is connected to each control terminal of the plurality of the high voltage side switching element.

7. The electric device according to claim 6, wherein a plurality of the low voltage side switching element are provided,
wherein the low voltage side part is connected to each control terminal of the plurality of the low voltage side switching element.

8. The electric device according to claim 1, wherein an inductance is present on the power line.

9. The electric device according to claim 1, comprising a battery pack configured to provide power to the motor,
wherein the drive voltage generated by the high voltage side part is higher than an output voltage of the battery pack.

10. The electric device according to claim 9, wherein the drive voltage generated by the low voltage side part is lower than the output voltage of the battery pack.

11. The electric device according to claim 1, comprising:
a current detection circuit configured to detect a drive current of the motor;
a voltage detection circuit configured to detect an input voltage of the inverter circuit;
a temperature detection circuit configured to detect a temperature of the motor or the inverter circuit; and
a control unit configured to connect to the current detection circuit, the voltage detection circuit, and the temperature detection circuit.

12. The electric device according to claim 11, wherein the control unit has a terminal connected the power line, a first output terminal of the high voltage side part, and a second output terminal of the low voltage side part.

13. The electric device according to claim 12, wherein the control unit has:
the inverter drive unit,
an arithmetic operation unit configured to output a control signal to the inverter drive unit, and
a constant voltage generation circuit configured to generate a constant voltage of the inverter drive unit and the arithmetic operation unit.

14. An electric device comprising:
a motor;
an inverter circuit configured to have a switching element including a high voltage side switching element connected to a power line on which a drive voltage of the motor is supplied and a low voltage side switching element connected to a ground line, and drive the motor; and a charge pump circuit configured to generate a drive voltage of the switching element; and an inverter drive unit configured to drive the inverter circuit, the inverter drive unit having a high voltage side part connected to a control terminal of the high voltage side switching element and a low voltage side part connected to the low voltage side switching element;

wherein a discharge element is provided between the power line and the high voltage side part, wherein the electric device further comprises a diode connecting an interconnection part of the high voltage side switching element and the low voltage side switching element and the high voltage side part, and wherein a cathode of the diode is connected to the high voltage side part.

15. The electric device according to claim 3, wherein the output terminal of the charge pump circuit has a higher potential than the power line.

16. The electric device according to claim 3, wherein the discharge element is a resistor.

17. The electric device according to claim 3, wherein the discharge element is a Zener diode.

* * * * *